United States Patent
Kim

(10) Patent No.: US 7,820,544 B2
(45) Date of Patent: Oct. 26, 2010

(54) METHOD FOR FORMING METAL WIRING OF SEMICONDUCTOR DEVICE AND A SEMICONDUCTOR DEVICE MANUFACTURED BY THE SAME

(75) Inventor: Seung Hyun Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 679 days.

(21) Appl. No.: 11/764,315

(22) Filed: Jun. 18, 2007

(65) Prior Publication Data

US 2007/0293046 A1    Dec. 20, 2007

(30) Foreign Application Priority Data

Jun. 20, 2006  (KR) ...................... 10-2006-0055278

(51) Int. Cl.
*H01L 21/4763*  (2006.01)
*H01L 21/44*  (2006.01)

(52) U.S. Cl. ...................... 438/622; 438/623; 438/626; 438/629; 438/675

(58) Field of Classification Search .................. 438/622, 438/623, 626, 629, 675
See application file for complete search history.

(56) References Cited

U.S. PATENT DOCUMENTS

| 7,432,192 B2 * | 10/2008 | Feng et al. | .................. 438/627 |
| 2002/0146901 A1 * | 10/2002 | Morozumi | .................. 438/622 |
| 2005/0029669 A1 * | 2/2005 | Inoue et al. | .................. 257/774 |
| 2007/0082479 A1 * | 4/2007 | Padhi et al. | .................. 438/629 |

* cited by examiner

*Primary Examiner*—Matthew C Landau
*Assistant Examiner*—James M Mitchell
(74) *Attorney, Agent, or Firm*—Lowe Hauptman Ham & Berner LLP

(57) ABSTRACT

A method for forming a metal wiring of a semiconductor device, includes forming a first metal layer on a wafer, partially etching a portion of the first metal layer where a metal wiring is to be formed, sequentially forming a first copper barrier layer, a copper seed layer, and a copper layer on the first metal layer, annealing the copper layer, polishing the resulting structure until the first metal layer is exposed, patterning the first metal layer and the first copper barrier layer to form a portion of a metal wiring, forming a second copper barrier layer, forming a second metal layer, and patterning the second metal layer and the second copper barrier layer to form the metal wiring.

6 Claims, 5 Drawing Sheets

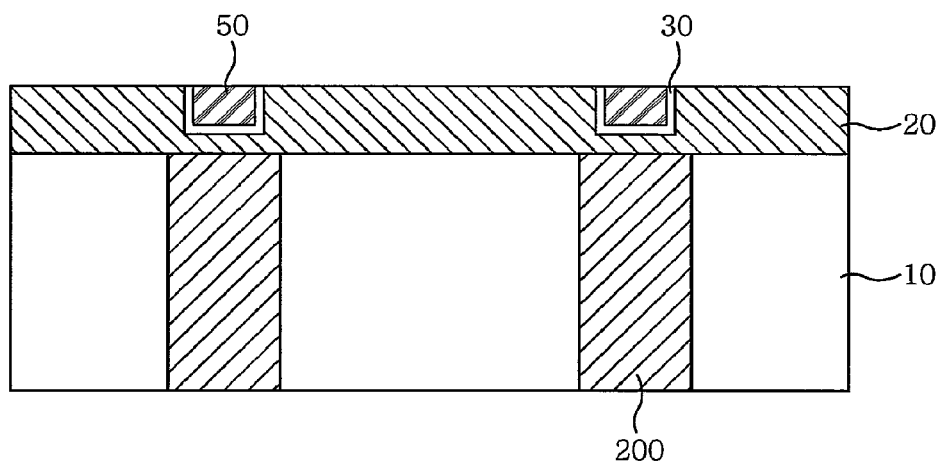
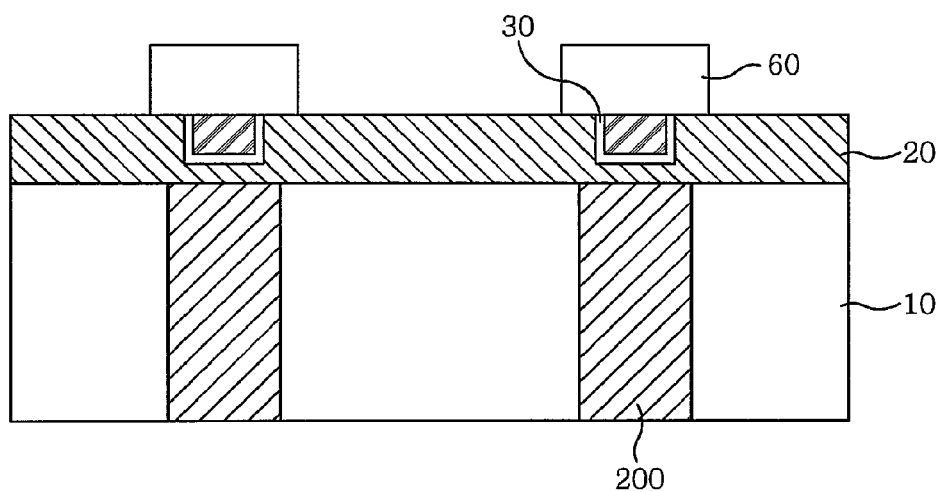
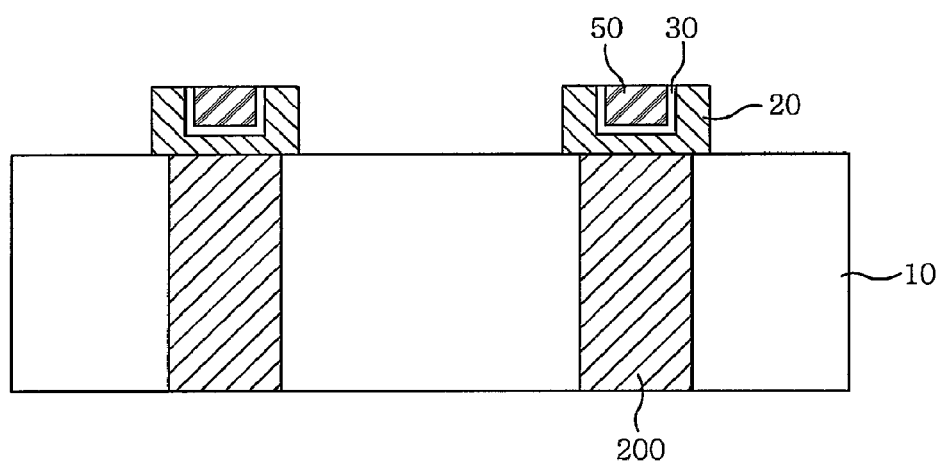

METHOD FOR FORMING METAL WIRING OF SEMICONDUCTOR DEVICE AND A SEMICONDUCTOR DEVICE MANUFACTURED BY THE SAME

FIELD OF THE INVENTION

The present invention relates to a method for forming a metal wiring of a semiconductor device and, more particularly, to a method for forming a metal wiring of a semiconductor device in which a copper wiring is formed within metal wirings such as aluminum wirings, and a semiconductor device manufactured by the same.

BACKGROUND OF THE INVENTION

Aluminum has been commonly used as a metal wiring material because it is easily deposited on wafers, etched with a solution that does not attack films under aluminum, and low-priced. However, as the semiconductor device is becoming highly integrated, the number of metal wirings increases and a pitch of metal wirings decreases. The reduction in the pitch of the metal wiring leads to an increase in a wiring resistance and causes an RC delay due to an increase in parasitic capacitance formed between adjacent wirings, thereby degrading a speed of the semiconductor device.

Thus, in line with the high integration of the semiconductor device, a method for lowering the wiring resistance has been studied, and as a solution, copper (Cu) having a low specific resistance and good reliability compared with aluminum (Al) has been adopted as a material of the metal wiring.

However, a copper wiring is disadvantageous in that it is not easily patterned through plasma etching unlike the aluminum wiring. Thus, in order to form the copper wiring, a dual damascene method is used, in which an insulation film is first deposited and etched, and then, copper is deposited and filled therein.

However, the dual damascene method can be hardly applied for the aluminum wiring process. Thus, in order to lower the wiring resistance, the thickness or the width of the aluminum wiring needs to be increased, and even in this case, actually, there is a limitation in lowering of the wiring resistance.

SUMMARY OF THE INVENTION

It is, therefore, an object of the invention to provide a method for forming a metal wiring of a semiconductor device in which a copper wiring is formed within a metal wiring such as an aluminum wiring in order to lower resistance, and a semiconductor manufactured by the same.

In accordance with an aspect of the present invention, there is provided a method for forming a metal wiring of a semiconductor device, including:

forming a first metal layer on a wafer;

partially etching a portion of the first metal layer where a metal wiring is to be formed;

sequentially forming a first copper barrier layer, a copper seed layer, and a copper layer on the first metal layer;

annealing the copper layer;

polishing the resulting structure through a chemical mechanical polishing method until the first metal layer is exposed;

patterning the first metal layer and the first copper barrier layer to form a portion of a metal wiring;

forming a second copper barrier layer;

forming a second metal layer; and patterning the second metal layer and the second copper barrier layer to form the metal wiring.

In accordance with another aspect of the present invention, there is provided a semiconductor device, including:

a first metal layer deposited on a wafer, a portion of the first metal layer being etched;

a first copper barrier layer and a copper layer sequentially deposited on the etched portion of the first metal layer;

a second copper barrier layer deposited on the surface of the first metal layer, the first copper barrier layer and the copper layer; and a second metal layer deposited on the second copper barrier layer.

As described above, as a semiconductor device becomes highly integrated, there is a limitation to obtain a desired metal wiring resistance with an aluminum wiring which is commonly used as a metal wiring material. Thus, in the present invention, after depositing and partially patterning a metal wiring such as the aluminum wiring, a copper film is deposited thereon and polished by chemical mechanical polishing. Thereafter, a copper wiring is formed within the metal wiring such as the aluminum wiring through an additional metal (aluminum) wiring deposition and patterning process, to thus prevent diffusion of copper and reduce resistance of the metal wiring.

BRIEF DESCRIPTION OF THE DRAWINGS

The above and other objects and features of the present invention will become apparent from the following description of embodiments given in conjunction with the accompanying drawings, in which:

FIGS. 1 to 13 are schematic sectional views sequentially showing processes of forming a metal wiring in accordance with an embodiment of the present invention.

DETAILED DESCRIPTION OF THE EMBODIMENTS

Hereinafter, embodiments of the present invention will be described in detail with reference to the accompanying drawings so that they can be readily implemented by those skilled in the art.

Referring to FIGS. 1 to 13, there are schematic views sequentially showing processes of forming a metal wiring by using aluminum as first and second metal layers in accordance with the present invention.

Figure 1:
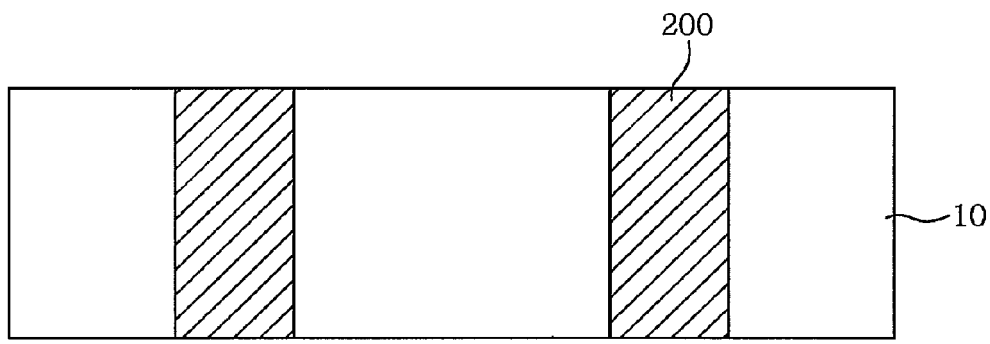

As shown in FIG. 1, an interlayer insulation film 10 is formed on wafer. There may exist several different layers (not shown) under the interlayer insulation film 10 or a tungsten plug 200 can be formed in the interlayer insulation film 10.

Figure 2:
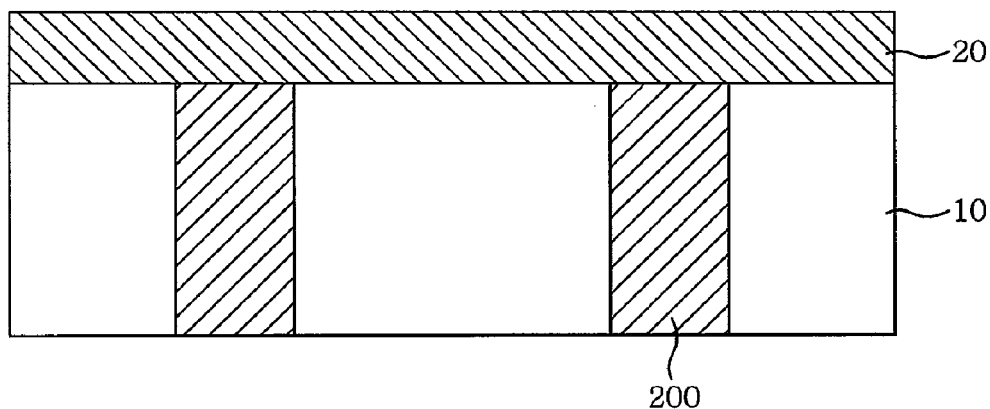

In order to form a metal wiring on the interlayer insulation film 10, as shown in FIG. 2, aluminum is deposited on the interlayer insulation film 10 under the conditions of 1~50 mTorr and argon gas of 5 sccm~100 sccm to form a first aluminum layer 20. And then, a photolithography process is performed to thereby form a desired metal wiring on the thusly formed substrate. In the photolithography process, first, photoresist 25 is formed on the wafer by spin coating. Next, ultraviolet rays are irradiated on the photoresist 25 through a reticle with a circuit pattern of an IC by using a device such as a stepper, etc., to transfer a pattern of the reticle onto the wafer.

Figure 3:
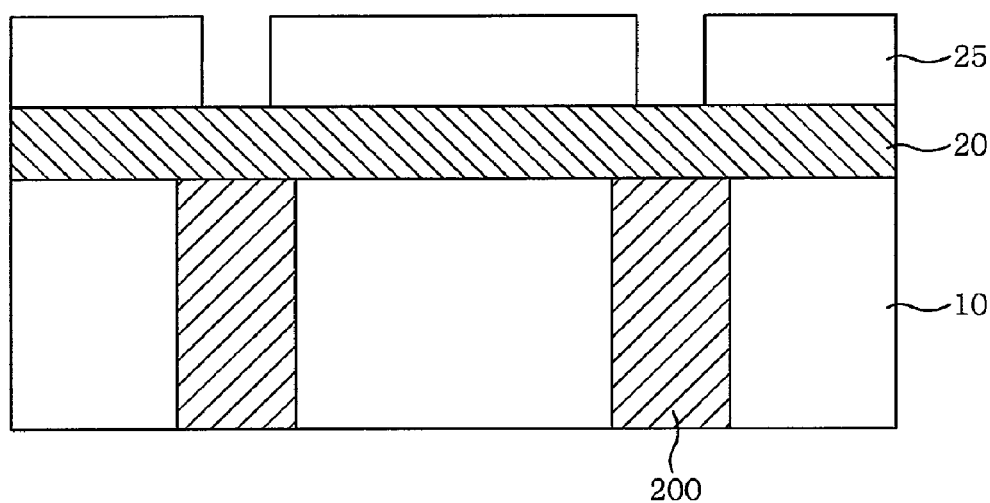

Thereafter, as shown in FIG. 3, in a developing process, the photoresist 25 which has been exposed to light is dissolved in a solvent while leaving a photoresist pattern on the wafer at portions which have not been exposed to light (in case of positive photoresist).

Figure 4:
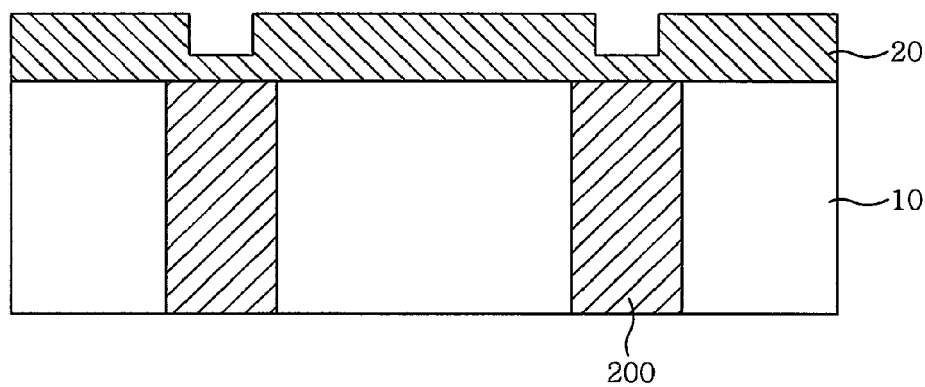

Subsequently, the first aluminum layer 20 is partially etched to have the same pattern as that of a mask through an etching process under pressure of 1~20 mTorr, and then, the photoresist 25 and impurities are removed through a cleaning process to obtain an aluminum wiring in such a shape as shown in FIG. 4.

Thereafter, copper is to be deposited on the aluminum wiring. In this case, copper generally diffuses quickly into oxide and silicon, and if copper diffuses into active regions of silicon (e.g., source, drain and gate regions of a transistor), it would cause junction leakage or an oxide leakage to damage the device. Therefore, in order to prevent the diffusion of copper, a first copper barrier metal 30 is first deposited through a physical vapor deposition (PVD) or a chemical vapor deposition (CVD).

Figure 5:
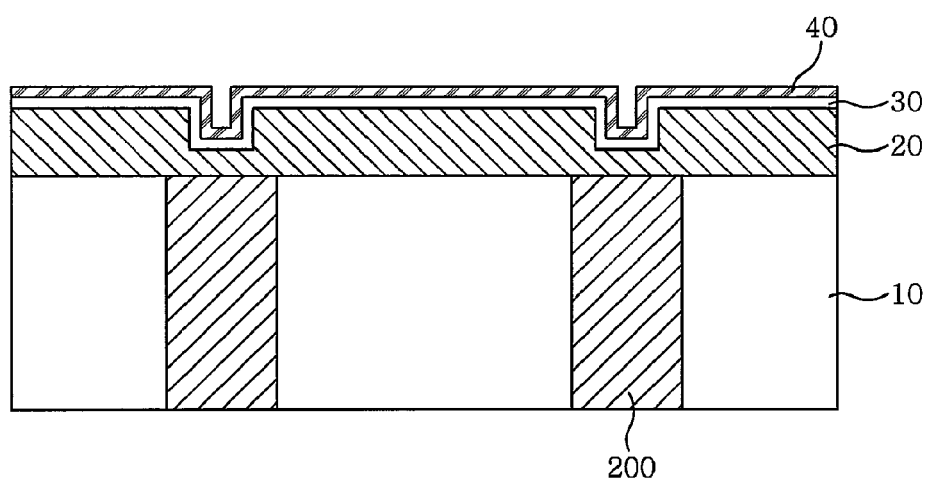
Figure 6:
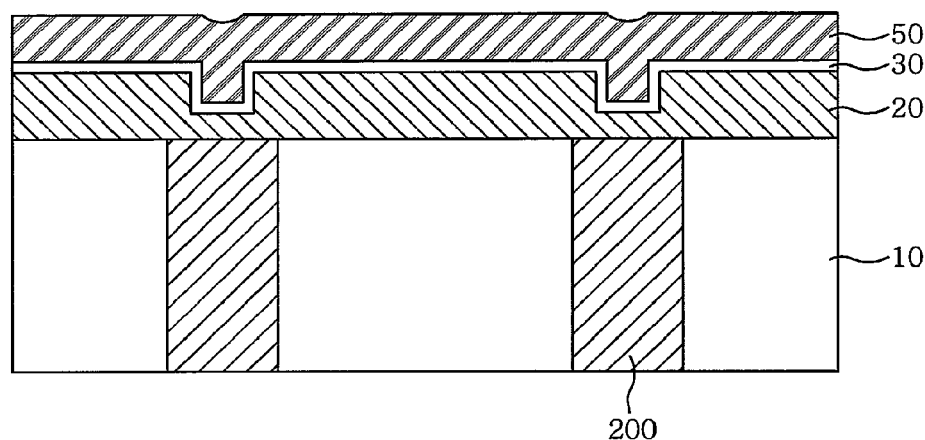

Thereafter, in order to make copper grow well on the first copper barrier metal 30, as shown in FIG. 5, a copper seed layer 40 is deposited on the first copper barrier metal 30. And then, copper 50 is grown thereon by an electrochemical plating (ECP) process to have a shape as shown in FIG. 6. In this case, the deposition of the first copper barrier metal 30 and copper seed layer 40 is performed at a pressure of 1~50 mTorr while supplying argon (Ar) gas at 5 sccm~100 sccm.

Further, in order to stabilize the deposition of copper, annealing is performed under the conditions of temperature of 50° C.~400° C. and pressure of 100~760 mTorr while supplying a nitrogen ($N_2$) gas of 5 SLM~50 SLM. The temperature is critical during the annealing operation. That is, annealing is not effective at 50° C. or below, and, in case of aluminum, if temperature of 400° C. or higher, an aluminum line may be affected because a melting point of aluminum is 660° C.

Thereafter, a chemical mechanical polishing method is performed to polish the copper layer 50 until the first metal layer of aluminum 20 is exposed, as shown in FIG. 7. In order to remove the first metal layer at portions other than portions where a metal wiring is to be formed, the photolithography process and the etching process are performed by using the above-mentioned photoresist 60, thus removing an aluminum wiring at an undesired portion as shown in FIGS. 8 and 9.

Figure 10:
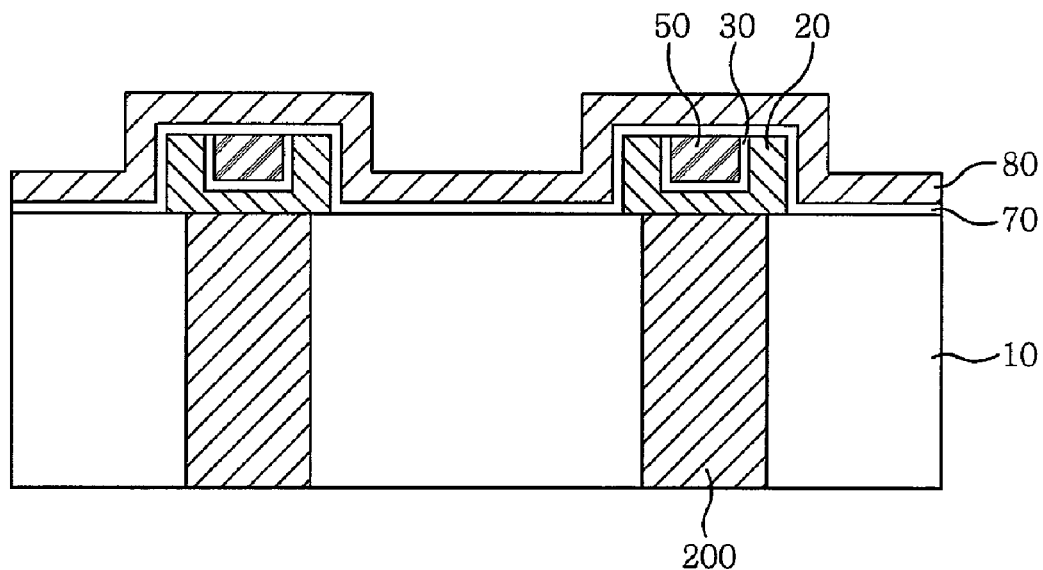
Figure 11:
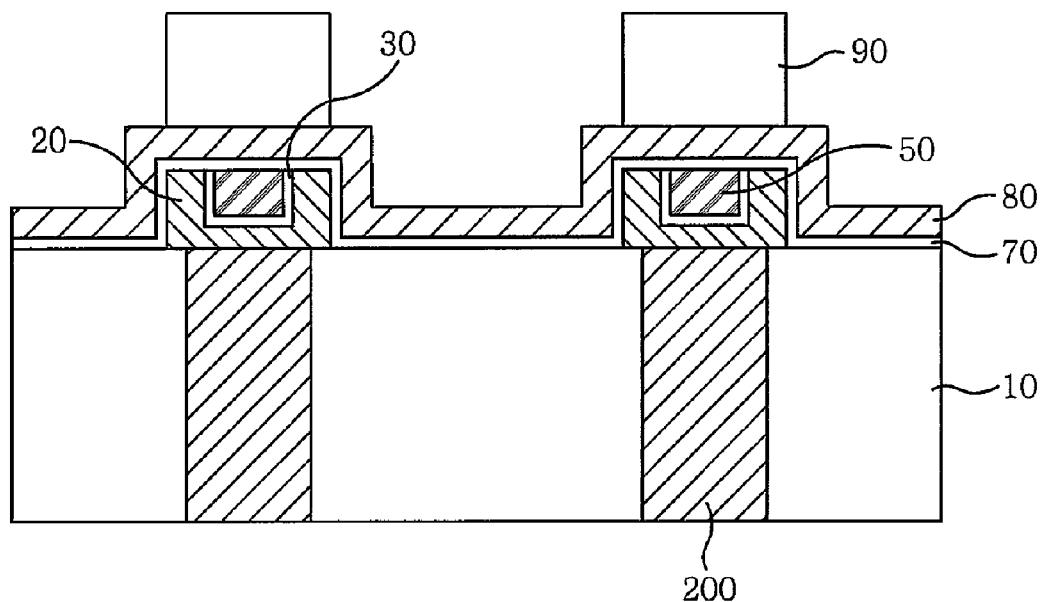
Figure 12:
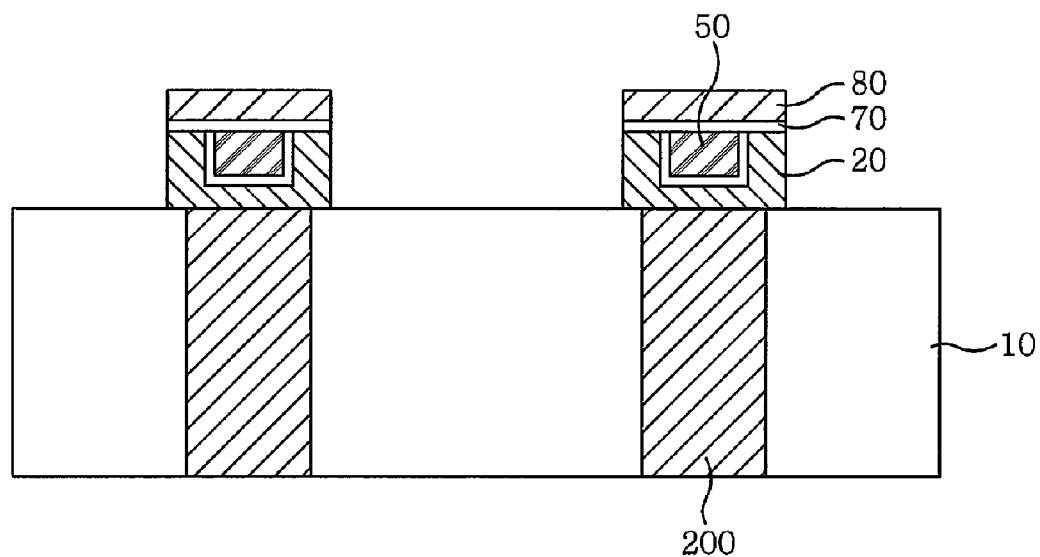

Subsequently, aluminum is deposited on the copper wiring to form the copper wiring within the aluminum wiring. For this purpose, first, a second copper barrier metal 70 is deposited to prevent diffusion of copper, on which a second aluminum layer 80 is then sequentially deposited as shown in FIG. 10. And then, in order to allow a metal wiring to remain only on a desired portion, the photolithography process and the etching process are performed by using the above-mentioned photoresist 90 as shown in FIG. 11. When the above-mentioned processes are all finished, the copper wirings are formed within the aluminum wirings as shown in FIG. 12, thereby preventing diffusion of copper and reducing resistance of the metal wirings.

Figure 13:
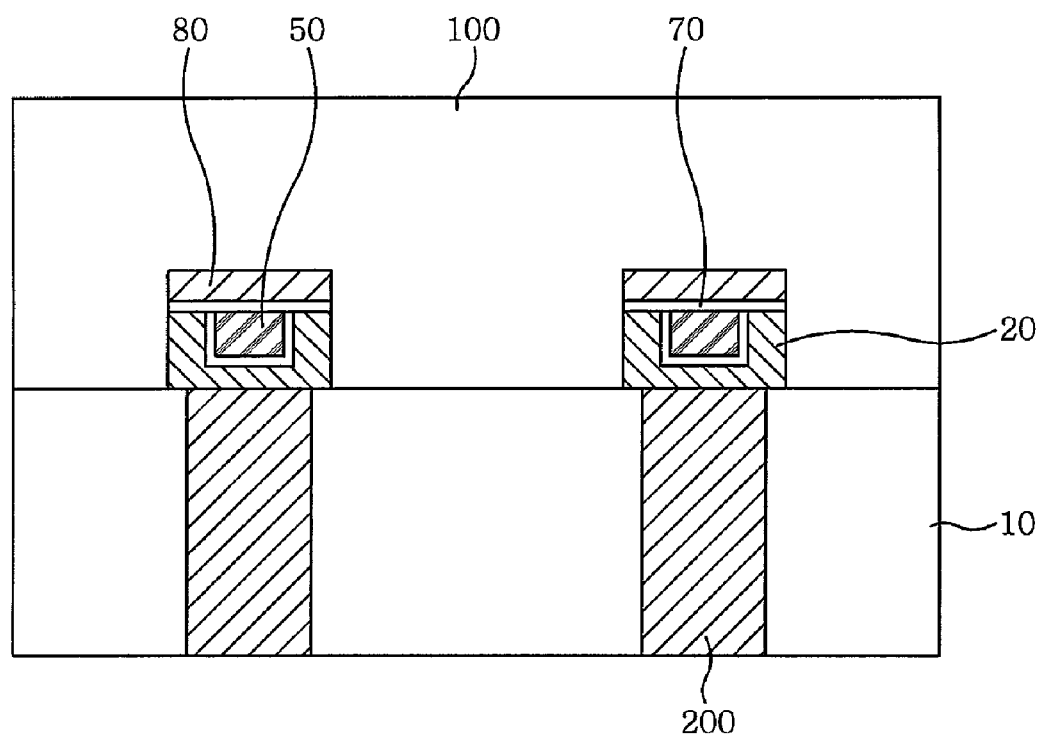

Thereafter, an interlayer insulation film 100 is grown and an upper portion of the interlayer insulation film 100 is polished through chemical mechanical polishing to complete the semiconductor device having the metal wirings as shown in FIG. 13.

Although there has been shown and described that aluminum is employed as the first and second metal layers in embodiments of the present invention, it is understood that any metal capable of being dry-etched can be employed as the first and second metal layers. For example, such metal includes titanium (Ti), Titanium Nitride (TiN), Tungsten (W), Tantalum (Ta), Tantalum Nitride (TaN) and the like.

As described above, without having to increase the thickness or width of the metal wirings such as aluminum wirings, resistance of the metal wirings can be reduced to thus maximize the speed of the device. Also, the copper wiring can be formed without using the damascene process. In addition, the copper wiring can be formed in various shapes by controlling patterning with respect to the metal wirings such as the aluminum wirings.

Although the invention has been shown and described with reference to certain exemplary embodiments thereof, it will be understood by those skilled in the art that various changes in form and details may be made therein without departing from the scope of the invention as defined by the appended claims.

What is claimed is:

1. A method for forming a metal wiring of a semiconductor device, comprising:
    forming a first metal layer on a wafer;
    partially etching a portion of the first metal layer where a metal wiring is to be formed;
    sequentially forming a first copper barrier layer, a copper seed layer, and a copper layer on the first metal layer;
    annealing the copper layer;
    polishing the resulting structure through a chemical mechanical polishing method until the first metal layer is exposed;
    patterning the first metal layer and the first copper barrier layer to form a portion of a metal wiring;
    forming a second copper barrier layer;
    forming a second metal layer; and
    patterning the second metal layer and the second copper barrier layer to form the metal wiring.

2. The method of claim 1, wherein each of the first and second metal layers includes a metal capable of being dry-etched.

3. The method of claim 2, wherein the metal includes aluminum.

4. The method of claim 2, wherein the metal includes titanium (Ti), Titanium Nitride (TiN), Tungsten (W), Tantalum (Ta), and Tantalum Nitride (TaN).

5. The method of claim 1, wherein annealing is performed on copper at 50° C. to 400° C.

6. The method of claim 1, further comprising:
    forming an insulation layer on the metal wiring; and
    performing chemical mechanical polishing on the insulation layer.

* * * * *